(12) United States Patent
Canfield et al.

(10) Patent No.: US 8,079,481 B2
(45) Date of Patent: Dec. 20, 2011

(54) INTEGRATED FRAME AND CENTRAL ELECTRONIC COMPLEX STRUCTURE

(75) Inventors: Shawn M. Canfield, Poughkeepsie, NY (US); John J. Loparco, Poughkeepsie, NY (US); Budy D. Notohardjono, Poughkeepsie, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 614 days.

(21) Appl. No.: 11/262,051

(22) Filed: Oct. 28, 2005

(65) Prior Publication Data

US 2007/0095774 A1    May 3, 2007

(51) Int. Cl.
  *H05K 7/14*    (2006.01)
(52) U.S. Cl. ........ 211/26; 211/184; 312/265.5; 361/727
(58) Field of Classification Search ............... 211/26, 211/184, 189, 52, 55, 59.2, 59.3; 220/4.28, 220/4.33, 529, 532; 312/257.1, 265.2, 265.5; 361/683, 679.32, 727, 728, 730, 752, 790, 361/797, 800; 439/501, 540.1
  See application file for complete search history.

(56) References Cited

U.S. PATENT DOCUMENTS

| | | | | |
|---|---|---|---|---|
| 1,487,856 A | * | 3/1924 | Hauserman et al. ............. 108/60 |
| 2,104,912 A | * | 1/1938 | Streeter .......................... 312/107 |
| 2,221,854 A | * | 11/1940 | Zalkind ............................ 52/100 |
| 2,527,226 A | * | 10/1950 | Levine ........................... 126/114 |
| 2,926,022 A | * | 2/1960 | Nau et al. ...................... 280/79.3 |
| 3,192,306 A | * | 6/1965 | Skonnord ...................... 174/16.1 |
| 3,730,605 A | * | 5/1973 | Eckard ........................ 312/265.5 |
| 3,733,523 A | * | 5/1973 | Reynolds et al. .............. 361/802 |
| 3,754,517 A | * | 8/1973 | Hassel et al. ..................... 108/61 |
| 3,807,572 A | * | 4/1974 | Luvara et al. ................... 211/10 |
| 4,305,504 A | * | 12/1981 | Bredal .......................... 206/577 |
| 4,327,835 A | * | 5/1982 | Leger ......................... 211/41.17 |
| 4,336,673 A | * | 6/1982 | Duchesne et al. ................. 52/27 |
| 4,356,531 A | * | 10/1982 | Marino et al. ................ 361/683 |
| 4,496,057 A | * | 1/1985 | Zenitani et al. ................. 211/26 |
| 4,553,674 A | * | 11/1985 | Yoshikawa et al. ............. 211/26 |
| 4,566,596 A | * | 1/1986 | Hennig ........................ 211/59.2 |

(Continued)

FOREIGN PATENT DOCUMENTS

CN        2276242 Y        3/1998

*Primary Examiner* — Darnell Jayne
*Assistant Examiner* — Joshua Rodden
(74) *Attorney, Agent, or Firm* — Dennis Jung

(57) ABSTRACT

A cabinet assembly is provided that can be quickly assembled and disassembled inside side racks used for the purpose of housing computer systems. The assembly comprises a plurality of side plates that can be secured to inside rack sides, preferably through flexible flanges, a plurality of top and bottom plates that can be secured to the side plates, and a mid-plate is disposed substantially horizontally between the top and bottom plates. Alternately, the assembly can also comprise at least one rear plate that can be secured to the side plates to provide a third side for the assembly. The rear plates having openings designed to allow for front to back air flow ventilation. The assembly can also have at least one divider plate, and preferably a plurality of divider plates, that can be secured to the top and bottom and/or mid-plate(s). In such a case, the divider plates are disposed above and/or below the mid-plate and preferably each have an upper divider plate and a lower divider plate.

17 Claims, 2 Drawing Sheets

U.S. PATENT DOCUMENTS

| | | | | |
|---|---|---|---|---|
| 4,595,105 A * | 6/1986 | Gold | | 211/43 |
| 4,615,276 A * | 10/1986 | Garabedian | | 108/61 |
| 4,691,644 A * | 9/1987 | Frydman | | 108/187 |
| 4,979,909 A * | 12/1990 | Andrews | | 439/352 |
| 4,997,240 A * | 3/1991 | Schmalzl et al. | | 312/265.4 |
| 5,130,887 A * | 7/1992 | Trelford | | 361/679 |
| 5,165,770 A * | 11/1992 | Hahn | | 312/265.4 |
| 5,325,975 A * | 7/1994 | Brown et al. | | 211/189 |
| 5,341,945 A * | 8/1994 | Gibson | | 211/184 |
| 5,372,262 A * | 12/1994 | Benson et al. | | 211/26 |
| 5,525,080 A * | 6/1996 | Calder et al. | | 439/709 |
| 5,584,396 A * | 12/1996 | Schmitt | | 211/26 |
| 5,593,046 A * | 1/1997 | Katsuura et al. | | 211/41.15 |
| 5,595,316 A * | 1/1997 | Gallarelli et al. | | 220/4.33 |
| 5,626,406 A * | 5/1997 | Schmid | | 312/334.28 |
| 5,785,400 A * | 7/1998 | Grieser et al. | | 312/334.12 |
| 5,897,180 A * | 4/1999 | Singer | | 312/265.3 |
| 5,934,485 A * | 8/1999 | Harris et al. | | 211/26 |
| 5,957,556 A * | 9/1999 | Singer et al. | | 312/223.6 |
| 6,102,214 A * | 8/2000 | Mendoza | | 211/26 |
| 6,129,429 A * | 10/2000 | Hardt et al. | | 312/223.2 |
| 6,293,637 B1 * | 9/2001 | Anderson et al. | | 312/265.1 |
| 6,425,488 B1 * | 7/2002 | Notohardjono et al. | | 211/26 |
| 6,425,648 B1 * | 7/2002 | Notohardjono et al. | | 312/265.4 |
| 6,443,315 B1 * | 9/2002 | Tabuchi | | 211/41.17 |
| 6,466,449 B1 * | 10/2002 | Sheen et al. | | 361/752 |
| 6,480,391 B1 * | 11/2002 | Monson et al. | | 361/752 |
| 6,481,582 B1 * | 11/2002 | Rinderer | | 211/26 |
| 6,517,174 B2 * | 2/2003 | Sevier | | 312/257.1 |
| 6,527,351 B1 * | 3/2003 | Sevier et al. | | 312/265.2 |
| 6,561,602 B1 * | 5/2003 | Sevier et al. | | 312/265.1 |
| 6,565,166 B1 * | 5/2003 | Bulk et al. | | 312/257.1 |
| 6,590,782 B2 * | 7/2003 | Fritz et al. | | 361/796 |
| 6,629,614 B2 * | 10/2003 | Jordan | | 211/26 |
| 6,688,708 B1 * | 2/2004 | Janson | | 312/200 |
| 6,695,149 B1 * | 2/2004 | Cote et al. | | 211/26 |
| 6,707,686 B2 * | 3/2004 | Fritz et al. | | 361/796 |
| 6,708,830 B2 * | 3/2004 | Mendoza | | 211/26 |
| 6,724,636 B2 * | 4/2004 | Yamamoto et al. | | 361/747 |
| 6,796,833 B2 * | 9/2004 | Baker | | 439/540.1 |
| 6,811,048 B2 * | 11/2004 | Lau | | 220/1.5 |
| 6,833,995 B1 * | 12/2004 | Hsue et al. | | 361/727 |
| 6,847,528 B2 * | 1/2005 | Sucharczuk et al. | | 361/796 |
| 6,918,499 B2 * | 7/2005 | De Land et al. | | 211/187 |
| 6,940,730 B1 * | 9/2005 | Berg et al. | | 361/796 |
| 6,963,495 B1 * | 11/2005 | Carullo et al. | | 361/818 |
| 6,991,115 B2 * | 1/2006 | Chow et al. | | 211/40 |
| 7,007,809 B2 * | 3/2006 | Greenside | | 211/41.17 |
| 7,040,491 B1 * | 5/2006 | Claprood et al. | | 211/26 |
| 7,042,736 B2 * | 5/2006 | Katakura et al. | | 361/797 |
| 7,042,737 B1 * | 5/2006 | Woolsey et al. | | 361/799 |
| 7,086,707 B2 * | 8/2006 | Wyatt et al. | | 312/265.4 |
| 7,099,160 B1 * | 8/2006 | Ice | | 361/802 |
| 7,172,077 B2 * | 2/2007 | Mendoza | | 211/26 |
| 7,259,326 B2 * | 8/2007 | Nguyen | | 174/50 |
| 7,277,273 B2 * | 10/2007 | Smith et al. | | 361/679 |
| 7,293,666 B2 * | 11/2007 | Mattlin et al. | | 211/189 |
| 7,298,624 B2 * | 11/2007 | Boswell et al. | | 361/727 |
| 7,316,461 B2 * | 1/2008 | Wyatt et al. | | 312/352 |
| 7,324,348 B2 * | 1/2008 | Berg et al. | | 361/752 |
| 7,349,226 B2 * | 3/2008 | Ice | | 361/796 |
| 7,369,416 B2 * | 5/2008 | Plabst | | 361/818 |
| 7,457,134 B2 * | 11/2008 | Ice | | 361/816 |
| 7,583,510 B2 * | 9/2009 | Wang | | 361/753 |
| 2002/0131257 A1 * | 9/2002 | Agard | | 361/796 |
| 2002/0162808 A1 * | 11/2002 | Jordan | | 211/26 |
| 2004/0031767 A1 * | 2/2004 | Ice | | 211/26 |
| 2004/0182799 A1 * | 9/2004 | Tachibana | | 211/26 |
| 2005/0168964 A1 * | 8/2005 | Plabst | | 361/816 |
| 2006/0002098 A1 * | 1/2006 | Berg et al. | | 361/796 |
| 2007/0210683 A1 * | 9/2007 | Adducci et al. | | 312/223.1 |
| 2008/0135503 A1 * | 6/2008 | Hidaka | | 211/26 |

* cited by examiner

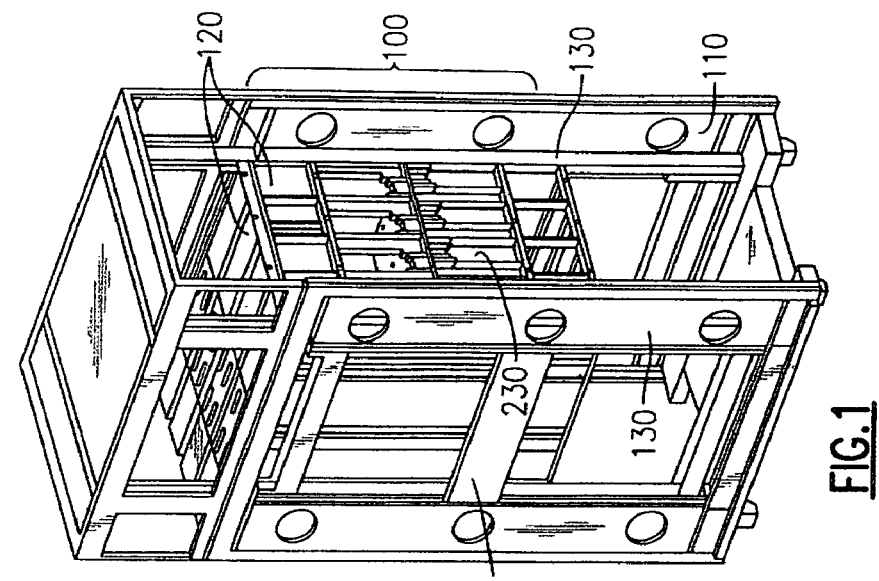
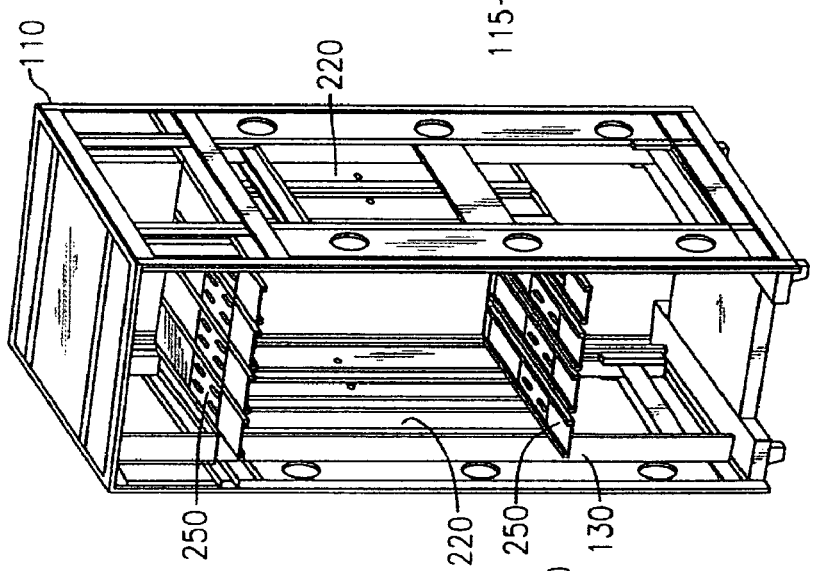
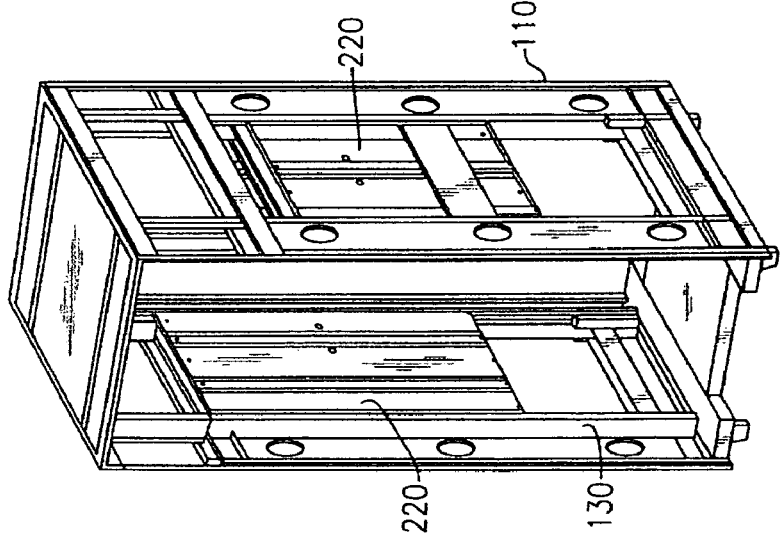

INTEGRATED FRAME AND CENTRAL ELECTRONIC COMPLEX STRUCTURE

CROSS-REFERENCE TO RELATED APPLICATIONS

This application contains subject matter which is related to the subject matter of the following co-pending applications, filed on the same day, which is assigned to the same assignee as this application, International Business Machines Corporation of Armonk, N.Y. Each of the below listed applications is hereby incorporated herein by reference in its entirety: Ser. Nos. 11/262,047 and 11/262,050.

TRADEMARKS

IBM® is a registered trademark of International Business Machines Corporation, Armonk, N.Y., U.S.A. S/390, Z900 and z990 and other names used herein may be registered trademarks, trademarks or product names of International Business Machines Corporation or other companies.

BACKGROUND OF THE INVENTION

1. Field of the Invention

This invention relates to packaging of computing systems and more particularly to packaging of large computing systems that include one or more central electronic complexes (CECs).

2. Description of Background

The industry trend has been to continuously increase the number of electronic components inside computing systems. A computing system can include a simple personal computer, a network of simple computers, or one or even a network of large computers that include one or more central electronic systems (CEC). While increasing the components inside a simple computing system does create some challenges, however, such an increase create many problems in computing systems that include one or more large computers. In such instances many seemingly isolated issues affect one another, especially when packaged together in a single assembly or networked or housed to other systems that are stored in close proximity.

One such particular challenge when designing computing system packaging is the issue of heat dissipation. Heat dissipation if unresolved, can result in electronic and mechanical failures that will affect overall system performance. As can be easily understood, the heat dissipation increases as the packaging density increases. In larger computing systems, such as the ones that include one or more CECs, the problem of heat dissipation becomes of particular concern.

Heat dissipated from packages residing in large computing systems affect the computing system's internal areas adjacent to heat producing components. However, this is not the only concern with large systems. Due to their large size and the number of heat producing packages, large computing systems can affect the temperature of the environment that they are housed in. Therefore, if several large computing systems are being stored within the same physical confines, improper cooling and unwanted heat dissipation from one or more such systems, can affect all such systems by affecting the temperature of the environment where the computing systems are being stored. The latter has become of special concern as of late and at times cost prohibitive solutions have been suggested in order to keep the environment where the computing systems are being stored at an acceptable temperature.

Another problem associated with computing systems, and especially large ones, is the issue of minimizing dynamic loading effects. In many instances CECs and other similar large computers are housed in an assembly and the assembly is then placed in a rack or frame with other CECs or components. Since every rack and every assembly often includes a variety of electronic components (such as daughter cards, elements and components that support logic entities, midplane boards and the like), in a dense packaging environment, the dynamic loading effects of such components can also cause electrical and mechanical failures if not dealt with adequately.

In order to minimize adverse dynamic loading effects, prior art frames that house CECs and other large computers have traditionally been designed such that they incorporate a self contained sheet metal enclosure design. In larger environments, traditionally vertically mounted mid-plane (with reference to ground plane) sections are also incorporated into this design. Consequently, to minimize dynamic loading issues, the prior art currently being practiced, provides for a box within a box approach and design that often incorporates such vertically mounted mid-plane sections. Unfortunately, the prior art approach has many inherent problems.

One problem associated with prior art box within a box designs that are currently being practiced, is the fact that this approach restricts packaging density within a specific system footprint that cannot easily be altered. This can limit the use and only allow the box to be use specific system. A different problem with box within a box approach is the problem of heat dissipation, as discussed previously. The box within box design in itself does impede proper ventilation for the system environment, but those designs that particularly incorporate the vertically mounted mid-plane sections intensify this problem further. This is because the vertically mounted mid-section impedes efficient ventilation, such as front to back aircooling of the components.

A different issue that has also been of special concern in the design of such large computing systems, besides dynamic loading and heat dissipation, has been the transportation and storage of such large units. Unfortunately, the box within a box approach creates problems with respect to the transportation, assembly and maintenance of large metal boxes that have to be mounted upon a rack or frame to eventually house the different units and components of the computing system as discussed.

Currently, there is no single design that can efficiently address all problems as enumerated above. Attempts to improve packaging designs to resolve one set of the previously enumerated problem(s) often cause other such problems to worsen. Consequently and in light of the prior art current designs that affect overall system performance of CECs and other similar computer systems, it is desirable to implement an assembly and corresponding method of packaging that can support high density components and address dynamic loading issues of such components while improving the ventilation problems. It would be of particular interest if such assembly and method suggests a viable option as to minimize the difficulties associated with transportation, assembly and storage of such units that will eventually assemble into a single computing system.

SUMMARY OF THE INVENTION

One example of the present invention is a cabinet assembly. The cabinet assembly includes a plurality of plates attachable with one another to form a cabinet for storing electronic components. At least two of the plates form side plates of the cabinet. At least one of the plates forms a top plate of the cabinet. At least one of the plates forms a bottom plate of the cabinet. The top plate and bottom plate secure the side plates and connect the side plates to one another. A mid-plate is disposed substantially horizontally between the top and bottom plates. Furthermore, the side plates are also secured to one another via the mid-plate. The cabinet assembly also includes a plurality of removable divider plates vertically mounted to the mid-plate. Each divider plate includes an upper plate positioned above the mid-plate and a lower plate positioned below the mid-plate and vertically aligned with the upper plate. The divider plates include a triangular lip with a substantially horizontal top portion providing support for components mounted in front of the assembly after the cabinet assembly is assembled. The lip is formed by the lower plate projecting horizontally farther than the upper plate.

Another example of the present invention is cabinet assembly including a plurality of side plates secured vertically to form sides of a cabinet for housing electronic components. The cabinet assembly includes a top horizontal plate and a bottom horizontal plate secured to the side plates and connecting them to one another. The cabinet assembly further includes at least one rear plate and a structurally rigid mid-plate. The rear plate is secured to the side plates to provide a third side of the cabinet. The mid-plate is secured horizontally to the side plates between the top and bottom plates. The mid-plate is adapted such that electronic nodes can attach to a top and a bottom of the mid-plate. The cabinet assembly additionally includes a plurality of removable vertical divider plates secured to the top and bottom horizontal plates and placed above and below the mid-plate. Each divider plate includes an upper plate positioned above the mid-plate and a lower plate positioned below the mid-plate and vertically aligned with the upper plate. The divider plates include a triangular lip with a substantially horizontal top portion providing support for components mounted in front of the assembly after the cabinet assembly is assembled. The lip is formed by the lower plate projecting horizontally farther than the upper plate.

Yet another example of the present invention is a method of constructing an assembly inside of a rack housing a computing system, with the assembly having easy to assemble building blocks. The method includes securing a plurality of side plates to inside rack sides and securing a top horizontal plate and a bottom horizontal plate to the side plates. The method further includes securing at least one rear plate to a flexible flange through the side plates such that a third side is created, and securing a structurally rigid mid-plate horizontally to the side plates in between the top and bottom horizontal plates. The mid-plate is adapted such that electronic nodes can be stacked on top of one another by being secured to a top and a bottom of the mid-plate. A mounting step mounts a plurality of removable divider plates vertically to the mid-plate. Each divider plate includes an upper plate positioned above the mid-plate and a lower plate positioned below the mid-plate and vertically aligned with the upper plate. The divider plates include a triangular lip having a substantially horizontal top portion providing support for components mounted in front of the assembly after the cabinet assembly is assembled. The lip is formed by the lower plate projecting horizontally farther than the upper plate.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 is an illustration of an assembly placed inside a rack used for housing a computing system as per one embodiment of the present invention;

FIGS. 3 and 4 provide an illustration of assembly process hierarchy using the components provided in FIG. 2 to achieve the embodiment of FIG. 1.

DESCRIPTION OF THE INVENTION

Figure 2:
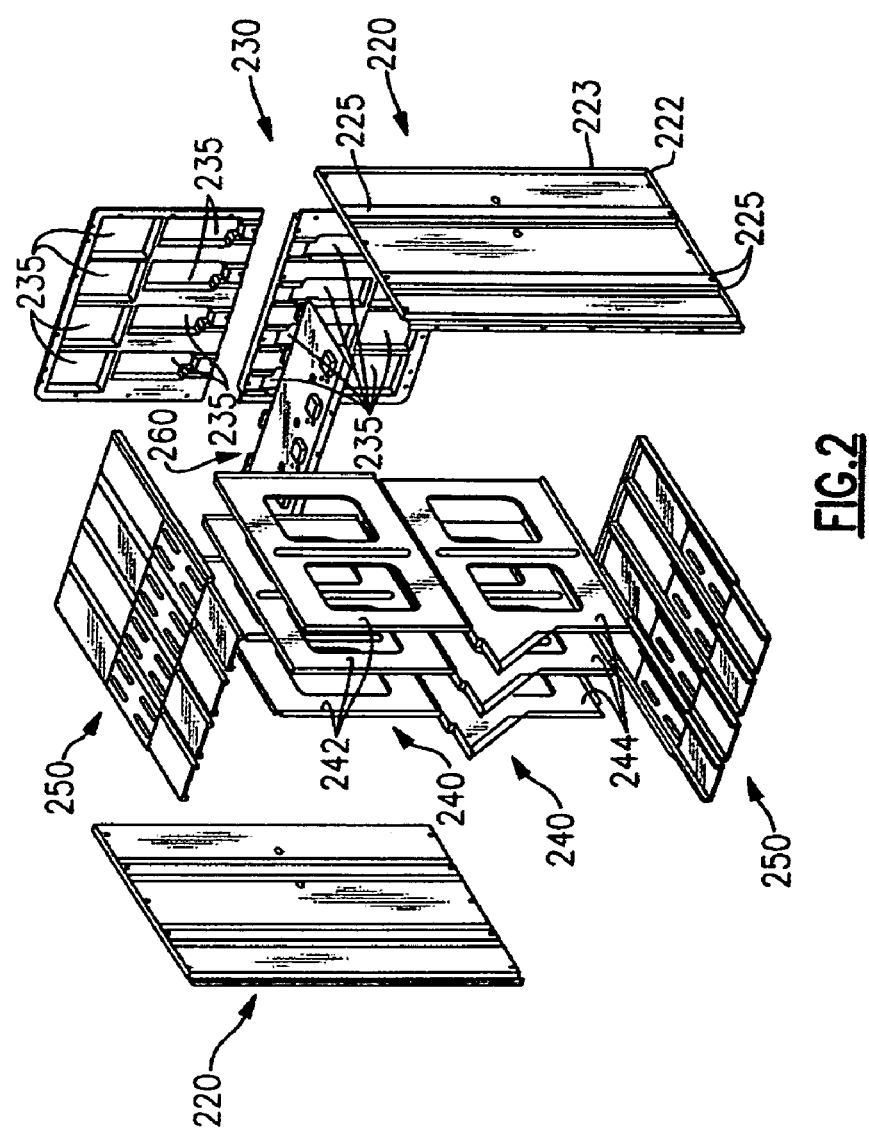
FIG. 2 is an illustration of an overall description of specific components as used in the embodiment of FIG. 1.

As discussed earlier, the box within a box approach of the prior art currently being practiced has many inherent problems. The present invention as will be discussed presently provides for an improved method and assembly that can easily be erected in place, minimizes dynamic loading effects and provides for efficient cooling of components. One embodiment of the present invention is provided in FIG. 1. While FIG. 1 provides for an already assembled view of the embodiment that houses the computing system, FIGS. 2 through 4 discuss the many components an different stages in assembling the components to achieve the embodiment of FIG. 1. Each of these Figures will presently be discussed in greater detail.

FIG. 1 is an illustration of one embodiment of the present invention showing an assembly 100 for housing a computing device or system (not illustrated), such as a central electronic complex (CEC). One or more CECs can then be placed on one or more racks or central frames, such as the one depicted as by way of example in FIG. 1 and referenced as 110. It should be noted that while the subject matter of the present invention will be hereinafter described with respect to housing a CEC system, however, any such discussion is for providing an ease of understanding and the teachings of the present invention is applicable to any integrated frame that houses computing devices.

As provided in FIG. 1, the assembly 100 can be assembled (and or disassembled) easily and in situ by securing one or more of its components to the sides 130 of the rack or frame. FIG. 1 is a depiction of already assembled components 120. FIG. 2, however, illustrates each particular component 120 in greater detail. FIGS. 3 and 4, illustrate the manner of assembly of the components 120 into its final form as depicted in FIG. 1.

As discussed earlier, one of the challenges with the increased packaging density as demanded by the industry is in resolving heat dissipation issues. As discussed the box within a box approach of the prior art does not provide or utilize an efficient approaches that can maximize air-cooling capabilities within a predefined system footprint. Since large computing devices and systems such as CEC, are employed to support logic entities, the traditional approach of the prior art has been to provide vertically mounted mid-planes and self contained sheet metal enclosures manifesting themselves in a box within a box approach that restricts packaging density and impedes efficient cooling approaches.

By contrast in the embodiment provided in FIG. 1, a mid-horizontally positioned mid-plate 260 is provided which will be discussed in more detail later in conjunction with FIG. 2. The rotation of the mid-plate 260, among other factors, provides efficient air flow patterns such as straight-line front to back airflow patterns in the present invention. In one embodiment of the present invention, the mid-plate 260 provides registration to be engageable to a mid-plane of a CEC in environments where a CEC is being used. Such registration can be varied as known to those skilled in the art and may include, but should not be limited to, the inclusion of pins or similar securing means.

The rotation of mid-plate mounting position to a horizontal position, in reference with the ground plane, alongside with structural integration of the computing device (i.e. CEC entity) 100 within the frame 110, however, not only improves the cooling efficiency but also greatly improves the packaging density. The air flow efficiency and packaging density greatly improves the overall system performance.

Another problem with the prior art designs, as was discussed earlier was the problem of transporting and placement of heavy box in box assemblies on one or more racks 110. The high end CEC or other computing devices and systems provided are much larger and heavier than their predecessors. For example, such a CEC may have the overall dimensions of 24 inches (rack) by 22 U's (each U being about 1.75 inches) high by 30 inches deep. Consequently, it is no longer feasible to just design a box to slide such a large frame or rack into it. In addition, the nonflexible approach taken by the prior art makes it impossible to enable a standard 19 inch rack to be adapted to be used in larger rack (i.e. 24 inch) designs which can add to cost and availability of resources. The present invention's approach as illustrated in FIG. 1 and further discussed in FIG. 2, is structurally integrated with one or more computing system(s) and does resolve all such problems.

In addition to providing packaging improvements and better cooling efficiencies, the teachings of the present invention has the added benefit of providing a simple approach to large computing systems and devices. This is because the components of the present invention as provided in FIG. 2, can easily be selectively shipped together or separately to the location where the large computing system or device 100 resides and assembled in lieu. This removes many concerns ranging from considerations in overall weight, actuation approaches, service requirements and other system cost restraints as well as the more obvious shipping and plating costs associated with providing framing for such large enclosures.

Now to better understand the role and positioning of the mid-plate and other components 120 of FIG. 1, FIG. 2 will be discussed in more detail. The components provided in FIG. 2 are designed to provide easy housing for larger and heavier computing devices and systems as well as the smaller ones as being currently provided by the prior art and addresses both the heat dissipation and the dynamic loading issues. In this way, the components 120, reflect a significant change in the manner the prior art integrates and approaches the housing of large computer systems and devices.

As stated, FIG. 2 is an illustration of different components that contribute to the construction of assembly 100 as illustrated in the embodiment of FIG. 1. FIG. 2 provides an overall description of the specific components 120 making up the computing device assembly 100 of FIG. 1. These components as will be discussed in conjunction with FIG. 2 will also then be individually discussed in view of FIGS. 3 and 4, which as indicated earlier provide the assembly process hierarchy of integrating the computing device into the assembly 100, with the last stage of such assembly hierarchy having being provided previously in FIG. 1.

The first component as illustrated in FIG. 2, are a plurality of side plates 220. In one embodiment of the present invention, the side plates 220 are symmetrical. In a preferred embodiment as shown in FIG. 2, when the assembly 100 is to specifically house one or more CECs, the symmetrical side plates 220 are referred to as symmetrical CEC side plates. In one embodiment of the present invention, as illustrated in FIG. 2, the side plates 220 are shown to be single structure substantially flat plates with raised components and grooves collectively shown as 225 to help guide the later addition of other plates and/or electronic components. The edges of the plates 223 are also selectively shaped as referenced at 222 to also accommodate the proper arrangement and engagement of the different components as will become apparent in later steps.

Other designs can also be utilized for the plates depending of the needs of the unit and engagement of the selection and engagement of the components that has to be accommodated.

In one embodiment of the present invention, the side plates are first assembled to the frame or rack 110 by securing them to a pair of flexible flanges 115, preferably flexible EIA flanges 115. In alternate embodiments where a different rack or frame structure 110 is used, similar flexible flanges or other such components can be substituted. The flexible flange approach in conjunction with the described elements of the present invention is particularly attractive as it enables a standard rack, such as a 19 inch rack, to be adapted for use with larger racks (i.e. 24 inch or larger) if desired, and therefore provides for cost effective and easier design and implementations. In a preferred embodiment, the side plates 220 are secured by pinning and/or bolting them to the flexible flanges 115 of the frame or rack 110. The successful securing of the side plates 220 to the frame 110 is better illustrated in FIG. 3. In a preferred embodiment, the adjustable flange is used such that it ensures positive clamping on both front and back (EIA) flanges from a shock and vibration perspective. The same pin, clamp or whatever mode of securing is used can be utilized for both the left and right sides (flipped 180 degrees when needed.) The flange panels 115 can also be pre-plated and or painted cold rolled steel.

It should also be noted that the flange 115 is preferably placed as to fall outside the usable area of the rack 110. An example of this preferred embodiment can be illustrated in reference to FIG. 3 were a typical 24 inch rack or frame 110 is illustrated. As shown in FIG. 3, the flange panels 115 are outside the useable 24 inch frame/rack 110 to optimize the packaging density.

Once the side plates are in place, the top and bottom plates 250 are then attached to the side plates 220. In a preferred embodiment of the present invention, the top and bottom plates are symmetrical and horizontal with regard to the ground plane and therefore for ease of understanding they will be hereinafter interchangeably referred to as top and bottom plates 250 or horizontal top and bottom plates 250, although being completely horizontal is only provided in one of many possible embodiments. Again as before these can be pinned and bolted and the same identical securing piece or part can be used for both the top and bottom. The securing of the horizontal plates 250 to the side planes 220 and the frame 110 is further illustrated in FIG. 4.

In an embodiment of the present invention, the horizontal plates 250 can be selectively formed to incorporate designs that can assist in the engagement of the components, deployment of parts or during servicing. In one embodiment of the present invention, the top and bottom plates can be identical but in a preferred embodiment as illustrated in FIG. 2 different types of guides are provided that are different in the top and bottom plates 250. One example of this is provided in FIG. 2, where a partial "C" shaped channel design is incorporated on the bottom plate 250 to assist in the deployment of the node during servicing, while the top plate may be conceived with "U" shaped channels formed into it. Either design incorporation can be achieved from pre-plated cold rolled steel, as known to those skilled in the art, but other materials and processing combinations can be as easily utilized as desired.

In addition to the side plates 220 and the horizontal plates 250, a plurality of top and bottom rear plates 230 are also provided. The top and bottom plates are symmetrical, in one embodiment of the present invention. In a preferred embodiment, as illustrated in FIG. 2, the plates are each selectively formed to have a plurality of openings, grooves and/or apertures referred by way of example as openings 235. These openings are provided to support front-to-back airflow while still providing structural integrity. In a preferred embodiment of the present invention, the rear plates 230 are conceived as an aluminum casting with the openings incorporated into them as discussed. It should be also pointed out, however, that as was previously the case, other processing techniques and materials and combinations are also possible.

It should be noted that the rear plates 230 are installed in a manner that will accommodate the hardware, such as the ones installed in CEC or other computing units that is to be housed in the frame or rack 110. In one preferred embodiment, as before, the rear plates 230 will be pinned to other CEC components for registration purposes and then bolted through the EIA flanges 115 of the frame 110 into the side plates 220. Identical P/N for both top and bottom plates can be used, as was the case in previous cases.

A board mounted mid-plate 260, can then be provided and assembled at this time as shown in FIGS. 1 and 2. Mid plate 260 provides mid-plane support as well as lateral support for the side plates 220. The mid plate 260, in one embodiment is also provided of metal castings, although as before other processing combinations can be selectively provided.

Divider plates 240 are then added above and below the mid-plate area to minimize deflection (especially when there is a mid plane) during logic card actuation. In one embodiment of the present invention, these plates are further divided and referred to as upper and lower divider plates 242 and 244 with each upper and lower portion leading to the formation of a single divider plate 240 as illustrated. In one embodiment of the present invention, as shown in FIG. 2, the upper and lower plates are formed to also have openings to accommodate electronic components and also to provide pre-guidance alignment for logic card installation. In a preferred embodiment, the design of the lower plates is unique as they address the need to provide additional support for horizontally mounted booklets in front of the board wherein the additional support is provided by a triangular lip having a substantially horizontal top portion, wherein the lip is formed by the lower plate projecting horizontally farther than the upper plate when the assembly 100 is assembled. In addition, vertical stiffeners can be added in the form of additional plates to even add to the structural rigidity of the overall assembly.

As before, the divider plates are conceived as pre-plated rolled steel and are bolted to the CEC structure, in the embodiments housing a CEC. However other manners of processing and securing (other than bolting) can also be achieved. It should also be noted that while the preferred embodiment of the present invention as illustrated in the Figures provides for three divider plates (3 uppers and 3 lowers), but the number of divider plates can be more or less than that discussed here and can be manipulated and altered, especially to support the needs of the mid plane frame portion of a CEC.

With the addition of the divider plates 240, the assembly 100 of the components as illustrated in FIG. 2 is completed. Once the various components of FIG. 2 are assembled as discussed above, the final structure of the embodiment of FIG. 1 is then achieved as previously stated. The final assembly provides for the integration of CEC and the frame and improves overall packaging density. The integration of the CEC and the frame, alongside with the particular design of the frames and its assemblies provides for and maximizes frontal areas available forced air-cooling. In addition, the integration of the frame and the computing device it houses in the manner discussed provides and enhances structural rigidity of the overall assembly.

Besides the many advantages provided as with regards to cooling and packaging, the present invention also facilitates the ability to provide support when there is problems. The integration of the CEC and frame also protects mid-plane (or mid plate as will the case be) horizontal units from adverse board deflections. In this way mid-plane boards can be populated in-house and/or retrofitted independently of the CEC structure.

Furthermore, the assembly of hardware can be integrated at a supplier, thereby minimizing assembly, stocking and shipping costs as discussed earlier. Besides, CEC construction methodology eliminates all welding and post plating which are processes that have historically been cost prohibitive and will continue to challenge the industry in many different respects.

The illustrations and diagrams depicted herein are just examples. There may be many variations to these diagrams or the steps or operations described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A cabinet assembly comprising:
   a plurality of plates attachable with one another to form a cabinet for storing electronic components, at least two of said plurality of plates forming side plates of said cabinet, at least one of said plurality of plates forming a top plate of said cabinet, at least one of said plurality of plates forming a bottom plate of said cabinet, said top plate and bottom plate securing said side plates and connecting said side plates to one another;
   a mid-plate disposed substantially horizontally between said top and bottom plates, said side plates also being secured to one another via said mid-plate; and
   a plurality of removable divider plates vertically mounted to the mid-plate, each divider plate including an upper plate positioned above the mid-plate and a lower plate positioned below the mid-plate and vertically aligned with the upper plate triangular lip having a substantially horizontal top portion, the divider plates including a providing support for components mounted in front of said assembly after the cabinet assembly is assembled, the lip being formed by the lower plate projecting horizontally farther than the upper plate.

2. The assembly of claim 1, wherein said assembly further comprises at least one rear plate that can be secured to said side plates to provide a third side for said assembly.

3. The assembly of claim 2, wherein said at least one rear plate has openings designed to allow for front to back air flow ventilation.

4. The assembly of claim 1, wherein:
said side plates have guides incorporated into their design for later securing of other plates and components to them.

5. The assembly of claim 1, wherein said top plate and bottom plate are placed horizontally and are symmetrical.

6. The assembly of claim 1, wherein said top and bottom plates further comprise guides for later deployment of other components.

7. The assembly of claim 6, wherein said top plate and bottom plate are identical.

8. The assembly of claim 6, wherein said guide in said top plate has one or more incorporated partial "u" shaped channel guide(s).

9. The assembly of claim 6, wherein said guide in said bottom plate has one or more incorporated partial "c" shaped channel guide(s).

10. The assembly of claim 1, further comprising at least one divider plate of the plurality of removable divider plates that can be secured to said top and bottom and/or mid-plate(s).

11. The assembly of claim 1, wherein said assembly is secured to a plurality of flexible flanges secured to side racks.

12. The assembly of claim 11, wherein said side plates are secured to said flexible flanges.

13. The assembly of claim 12, wherein:
said assembly further comprises at least one rear plate that can be secured to said side plates to provide a third side for said assembly, and
said rear plate(s) is also secured to said rack through attachment to said flexible flange.

14. The assembly of claim 13, wherein said rear plate(s) is secured to said flange through said side plates.

15. A cabinet assembly comprising:
a plurality of side plates secured vertically to form sides of a cabinet for housing electronic components;
a top horizontal plate and a bottom horizontal plate secured to said side plates and connecting them to one another;
at least one rear plate secured to said side plates to provide a third side of said cabinet;
a structurally rigid mid-plate secured horizontally to said side plates between said top and bottom plates, the mid-plate adapted such that electronic nodes can attach to a top and a bottom of said mid-plate; and
a plurality of removable vertical divider plates secured to said top and bottom horizontal plates and placed above and below said mid-plate, each divider plate including an upper plate positioned above the mid-plate and a lower plate positioned below the mid-plate and vertically aligned with the upper plate triangular lip having a substantially horizontal top portion, the divider plates including a providing support for components mounted in front of said assembly after the cabinet assembly is assembled, the lip being formed by the lower plate projecting horizontally farther than the upper plate.

16. The method of constructing an assembly inside of a rack housing a computing system, said assembly having easy to assemble building blocks, comprising:
securing a plurality of side plates to inside rack sides;
securing a top horizontal plate and a bottom horizontal plate to said side plates;
securing at least one rear plate to a flexible flange through said side plates such that a third side is created;
securing a structurally rigid mid-plate horizontally to said side plates in between said top and bottom horizontal plates, the mid-plate adapted such that electronic nodes can be stacked on top of one another by being secured to a top and a bottom of said mid-plate;
mounting a plurality of removable divider plates vertically to the mid-plate, each divider plate including an upper plate positioned above the mid-plate and a lower plate positioned below the mid-plate and vertically aligned with the upper plate triangular lip having a substantially horizontal top portion, the divider plates including a providing support for components mounted in front of said assembly after the cabinet assembly is assembled, the lip being formed by the lower plate projecting horizontally farther than the upper plate.

17. The method of claim 16 wherein said assembly is secured to said side rack by a plurality of flexible flanges further comprising the step of disposing the plurality of divider plates above and below said mid-plate and securing said divider plates to said top and bottom horizontal or mid-plates.

* * * * *